(12) United States Patent
Oh

(10) Patent No.: US 10,115,766 B2
(45) Date of Patent: Oct. 30, 2018

(54) STRETCHABLE DISPLAY APPARATUS

(71) Applicant: SAMSUNG DISPLAY CO., LTD., Yongin-si, Gyeonggi-do (KR)

(72) Inventor: Hyunjoon Oh, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/371,827

(22) Filed: Dec. 7, 2016

(65) Prior Publication Data

US 2017/0271398 A1    Sep. 21, 2017

(30) Foreign Application Priority Data

Mar. 18, 2016  (KR) .................. 10-2016-0032904

(51) Int. Cl.
*H01L 27/15* (2006.01)
*H01L 27/02* (2006.01)
*H01L 27/12* (2006.01)

(52) U.S. Cl.
CPC ........ *H01L 27/156* (2013.01); *H01L 27/0207* (2013.01); *H01L 27/1218* (2013.01)

(58) Field of Classification Search
CPC ....... H01L 2924/00; H01L 2924/15788; H01L 2924/181; H01L 2924/00014; H01L 2924/12036; H01L 2924/12041; H01L 2924/12042; H01L 2224/48091; H01L 25/0753; H01L 2924/01322; H01L 2924/12033; H01L 2924/01; H01L 51/0097; H01L 51/5206; H01L 51/5221; H01L 27/3244; H01L 2251/5338

USPC ........................................ 257/79, 84, 88, 89
See application file for complete search history.

(56) References Cited

U.S. PATENT DOCUMENTS

| 7,888,690 | B2* | 2/2011 | Iwafuchi | H01L 21/2007 257/89 |
| 8,729,524 | B2* | 5/2014 | Rogers | H01L 21/8258 257/40 |
| 9,306,180 | B2* | 4/2016 | Kim | H01L 51/0097 |
| 9,647,171 | B2* | 5/2017 | Rogers | H01L 25/0753 |
| 9,723,711 | B2* | 8/2017 | Elolampi | H01L 23/13 |
| 2010/0213819 | A1* | 8/2010 | Cok | H01L 27/3255 313/498 |

(Continued)

FOREIGN PATENT DOCUMENTS

| KR | 101404472 B1 | 5/2014 |
| KR | 1014369060000 B1 | 8/2014 |

OTHER PUBLICATIONS

Jaeyi Chun et al., Transfer of GaN LEDs from Sapphire to Flexible Substrates by Laser Lift-Off and Contact Printing, Dec. 1, 2012, pp. 2115-2118, vol. 24, No. 23, IEEE Photonics Technology Letters.

(Continued)

*Primary Examiner* — Edward Chin
(74) *Attorney, Agent, or Firm* — Cantor Colburn LLP

(57) ABSTRACT

A display apparatus includes a plurality of light-emitting diodes ("LED"s); a stretchable substrate including a flat portion, and a plurality of protrusions protruding from the flat portion, where each of the protrusions has bent surfaces, and at least some of the light-emitting diodes are disposed on the protrusions; and a plurality of thin film transistors in the stretchable substrate and connected to the LEDs.

20 Claims, 29 Drawing Sheets

(56) References Cited

U.S. PATENT DOCUMENTS

| | | | |
|---|---|---|---|
| 2014/0144480 A1* | 5/2014 | Lee | H01L 31/048 136/244 |
| 2016/0004298 A1* | 1/2016 | Mazed | G06F 3/011 345/633 |
| 2016/0198567 A1* | 7/2016 | Hong | H05K 1/0283 362/418 |
| 2017/0040306 A1* | 2/2017 | Kim | H01L 25/167 |
| 2017/0046501 A1* | 2/2017 | Coleman | A61J 1/035 |
| 2017/0200707 A1* | 7/2017 | Rogers | H01L 25/0753 |
| 2017/0210117 A1* | 7/2017 | Rogers | B41F 16/00 |

OTHER PUBLICATIONS

Sheng Xu et al., Stretchable batteries with self-similar serpentine interconnects and integrated wireless recharging systems, Article, Published Feb. 26, 2013, pp. 1-8, Nature Communications.

* cited by examiner

STRETCHABLE DISPLAY APPARATUS

This application claims priority to Korean Patent Application No. 10-2016-0032904, filed on Mar. 18, 2016, and all the benefits accruing therefrom under 35 U.S.C. § 119, the content of which in its entirety is herein incorporated by reference.

BACKGROUND

1. Field

One or more embodiments relate to a stretchable display apparatus.

2. Description of the Related Art

A light-emitting diode ("LED") is a semiconductor device, in which holes and electrons are injected when a voltage is applied to a PN junction diode in a forward direction, and the holes and the electrons recombine to generate energy that is converted into light energy.

An inorganic LED emitting light by using an inorganic compound is being widely used as a backlight of a liquid crystal display ("LCD") device, an illumination, and an electronic display board. An organic LED emitting light by using an organic compound is used widely in from electronic devices such as mobile phones to large televisions.

Recently, a display apparatus that is flexible and stretchable using LEDs has been suggested.

SUMMARY

One or more embodiments include a stretchable display apparatus having less variation in luminance when being stretched.

Additional aspects will be set forth in part in the description which follows and, in part, will be apparent from the description, or may be learned by practice of the presented embodiments.

According to one or more embodiments, a display apparatus includes: a plurality of light-emitting diodes ("LED"s); a stretchable substrate including a flat portion and a plurality of protrusions protruding from the flat portion, where each of the protrusions has a bent surface, and at least some of the LEDs are disposed on the protrusions; and a plurality of thin film transistors disposed in the stretchable substrate and connected to the LEDs.

In an embodiment, the bent surface of each of the protrusions may include an inclined surface, and an LED of the LEDs may be disposed on the inclined surface.

In an embodiment, the stretchable substrate may further include a barrier wall disposed between the LEDs.

In an embodiment, the barrier wall may be disposed on the flat portion and between two adjacent protrusions of the protrusions.

In an embodiment, the barrier wall may be disposed on a center of a protrusion of the f protrusions.

In an embodiment, the barrier wall may include a reflective plate or am absorption plate.

In an embodiment, the display apparatus may further include a stretchable film on the stretchable substrate and in contact with surfaces of the protrusions, where the LEDs may be disposed on the stretchable film.

In an embodiment, each of the protrusions may include two side surfaces having inclination angles with respect to the flat portion and spaced apart from each other, and an upper flat surface connecting the two side surfaces.

In an embodiment, the LEDs may include: a first LED on the upper flat surface; and a second LED on at least one of the two side surfaces.

In an embodiment, the first LED may operate as a display pixel, which is turned on or off in response to image information, independently of a stretched degree of the stretchable substrate.

In an embodiment, the second LED may not operate as the display pixel in a state in which the stretchable substrate is not stretched or is stretched less than a predetermined stretched degree, and may operate as the display pixel in a state in which the stretchable substrate is stretched by the predetermined stretched degree or greater.

In an embodiment, one or more of the second LED define one pixel, and a number of the second LED in the one pixel may vary depending on the stretched degree of the stretchable substrate.

In an embodiment, the LEDs may further include a third LED disposed on the flat portion and between two adjacent protrusions of the protrusions.

In an embodiment, the first LED and the third LED may operate as a display pixel, which is turned on or off in response to image information, independently of a stretched degree of the stretchable substrate.

In an embodiment, the second LEDs may not operate as the display pixel in a state in which the stretchable substrate is not stretched or is stretched less than a predetermined stretched degree, and may operate as the display pixel in a state in which the stretchable substrate is stretched by the predetermined stretched degree or greater.

In an embodiment, a cross-sectional shape of each of the protrusions may be a reverse trapezoidal shape, in which an upper surface is larger than a lower surface.

In an embodiment, the LEDs may include: a first LED on the upper flat surface; and a second LED on the flat portion and between two adjacent protrusions of the protrusions.

In an embodiment, the first LED may operate as a display pixel, which is turned on or off in response to image information, independently of a stretched degree of the stretchable substrate.

In an embodiment, the second LED may not operate as the display pixel in a state in which the stretchable substrate is not stretched or is stretched less than a predetermined stretched degree, and may operate as the display pixel in a state in which the stretchable substrate is stretched by the predetermined stretched degree or greater.

In an embodiment, the display apparatus may further include a stretchable film on the stretchable substrate and in contact with the two side surfaces and the upper flat surface of each of the protrusions, and the LEDs may be disposed on the stretchable film.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
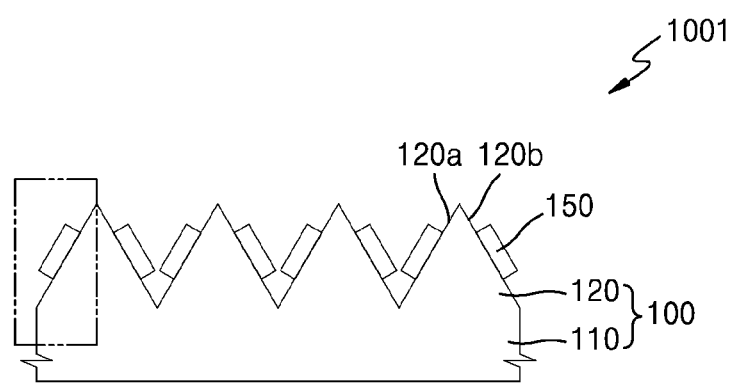
FIG. 1 is a schematic cross-sectional view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of" when preceding a list of elements, modify the entire list of elements and do not modify the individual elements of the list.

Hereinafter, the present disclosure will be described in detail by explaining preferred embodiments of the inventive concept with reference to the attached drawings. Like reference numerals in the drawings denote like elements.

It will be understood that when an element is referred to as being "on" another element, it can be directly on the other element or intervening elements may be present therebetween. In contrast, when an element is referred to as being "directly on" another element, there are no intervening elements present.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. "Or" means "and/or." As used herein, the term "and/or" includes any and all combinations of one or more of the associated listed items.

It will be further understood that the terms "comprises" and/or "comprising" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, the following embodiments are not limited thereto.

Figure 2:
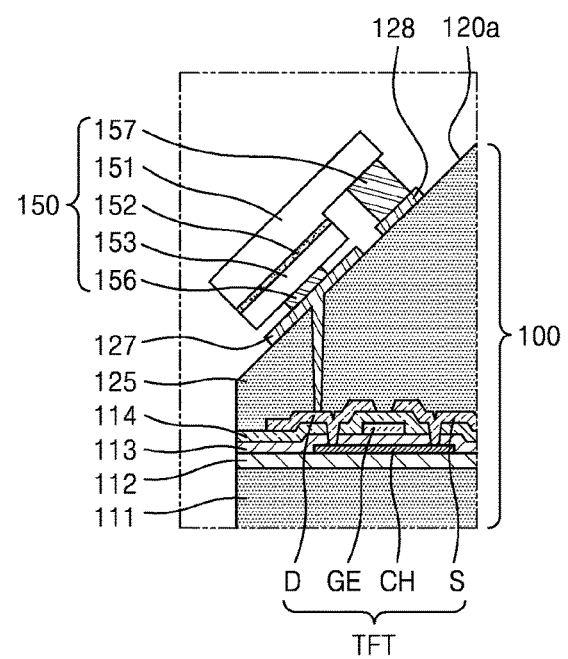
FIG. 2 is an enlarged view of a part of the display apparatus of FIG. 1.

FIG. 1 is a schematic cross-sectional view of a display apparatus 1001 according to an embodiment, and FIG. 2 is an enlarged view of a part of the display apparatus 1001 of FIG. 1.

The display apparatus 1001 includes a stretchable substrate 100 and a plurality of light-emitting diodes (LEDs) 150 on the stretchable substrate 100. The stretchable substrate 100 includes a flat portion 110, and a plurality of protrusions 120 having surfaces protruding from the flat portion 110 and bent. The flat portion 110 and the protrusions 120 are defined by dividing a region of the stretchable substrate 100 based on shapes thereof. The protrusions 120 are regions, protruding degrees of which vary according to extension or reduction of the stretchable substrate 100, that is, regions including inclined surfaces 120a and 120b having variable inclination angles, and remaining region is referred to as the flat portion 110.

The display apparatus 1001 further includes a thin film transistor TFT that controls driving of the LEDs 150. The thin film transistor TFT may be disposed on the stretchable substrate 100, as shown in FIG. 2. In one embodiment, for example, the thin film transistor TFT is disposed on a substrate 111 including a stretchable material, and a stretchable insulating layer 125 including a stretchable material may be disposed on the thin film transistor TFT. In FIG. 2, the thin film transistor TFT is embedded in the flat portion 110, but one or more embodiments are not limited thereto. The stretchable substrate 100 may include the thin film transistor TFT anywhere therein.

Referring to FIG. 2, components of the display apparatus 1001 will be described below.

The substrate 111 may include a stretchable material. In one embodiment, for example, the substrate 111 may include at least one of elastomeric silicon, elastomeric polyurethane, elastomeric polyisoprene, and elastomeric urethane acrylate. The substrate 111 may include a transparent material or an opaque material. In an embodiment, where the display apparatus 1001 is a transparent display apparatus, the substrate 111 may include a transparent or a semi-transparent material. In an alternative embodiment, where the display apparatus 1001 is a top emission type, the substrate 111 may include an opaque material.

In an embodiment, a buffer layer 112 may be disposed on the substrate 111 to form the thin film transistor TFT. The buffer layer 112 may provide a planarization surface above the substrate 111, and may effectively prevent impurities or moisture from infiltrating into the substrate 111. In one embodiment, for example, the buffer layer 112 may include an inorganic material, such as silicon oxide, silicon nitride, silicon oxynitride, aluminum oxide, aluminum nitride, titanium oxide and titanium nitride, or an organic material, such as polyimide, polyester and acryl, and may have a multi-layered structure including at least one of the materials listed above.

The thin film transistor TFT may include a channel layer CH, a gate electrode GE, a source electrode S, and a drain electrode D. In an embodiment, the thin film transistor TFT may be a top gate type, in which the gate electrode GE is disposed on the channel layer CH, but is not limited thereto. Alternatively, the thin film transistor TFT may be a bottom gate type.

The channel layer CH may include a semiconductor material, for example, amorphous silicon or polycrystalline silicon, but is not limited thereto. The channel layer CH may include, for example, an organic semiconductor material. In an embodiment, the channel layer CH may include a semiconductor oxide material. In one embodiment, for example, the channel layer CH may include an oxide of at least one material selected from group-XII, group-XIII, and group-XIV metal elements such as zinc (Zn), indium (In), gallium (Ga), tin (Sn), cadmium (Cd) and germanium (Ge), and a combination thereof.

A gate insulating layer 113 is disposed on the buffer layer 112 to cover the channel layer CH thereon. The gate insulating layer 113 insulates the channel layer CH from the gate electrode GE. The gate insulating layer 113 may have a single-layered structure or a multi-layered structure including a layer that includes an inorganic material such as silicon oxide and/or silicon nitride.

The gate electrode GE is disposed on the gate insulating layer 113. The gate electrode GE may be connected to a gate line (not shown) that transmits turn-on/turn-off signals to the thin film transistor TFT.

The gate electrode GE may include a low-resistive metal material. The gate electrode GE may have a single-layered or multi-layered structure including at least one selected from, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W) and copper (Cu). The material of the gate electrode GE may be determined taking into account attachment to adjacent layers, a surface flatness of the stacked layers, and processability.

An interlayer insulating layer 114 is disposed on the gate electrode GE. The interlayer insulating layer 114 insulates the source electrode S and the drain electrode D from the gate electrode GE. The interlayer insulating layer 114 may have a single-layered structure or a multi-layered structure including an inorganic material. In one embodiment, for example, the inorganic material may be a metal oxide or a metal nitride, and in particular, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The source electrode S and the drain electrode D are disposed on the interlayer insulating layer 114. The source electrode S and the drain electrode D may each have a single-layered structure or a multi-layered structure including at least one selected from Al, Pt, Pd, Ag, Mg, Au, Ni, Nd, Ir, Cr, Li, Ca, Mo, Ti, W, and Cu. The source electrode S and the drain electrode D contact the channel layer CH.

A stretchable insulating layer 125 is disposed on a thin film transistor TFT. The stretchable insulating layer 125 covers the thin film transistor TFT to remove level difference or steps caused by the thin film transistor TFT, and has an inclined surface 120a, an inclination angle of which varies based on extension or reduction of the stretchable substrate 100. The stretchable insulating layer 125 includes a stretchable material that is the same as the material of the substrate 111. However, embodiments are not limited thereto. In an alternative embodiment, the stretchable insulating layer 125 includes a stretchable material that is different from the material of the substrate 111. The stretchable insulating layer 125 may include, for example, at least one selected from elastomeric silicone, elastomeric polyurethane, elastomeric polyisoprene, and elastomeric urethane acrylate. The stretchable insulating layer 125 may include a transparent material or an opaque material.

A first electrode 127 and a second electrode 128 are disposed on the inclined surface 120a. A portion of the first electrode 127 may extend through the stretchable insulating layer 125 to be electrically connected to the drain electrode D of the thin film transistor TFT. The second electrode 128 functions as a common electrode for providing a reference voltage, when a voltage for generating an electric field in the LED 150 is applied between the second electrode 128 and the first electrode 127. In one embodiment, for example, the second electrodes 128 that are electrically connected to the LEDs 150 may be electrically connected to one another so that a reference common voltage may be applied to the LEDs 150, and the first electrodes 127 may be respectively connected to the thin film transistors TFT that are provided separately from each other. The LED 150 is disposed on the inclined surface 120a, and a first electrode pad 156 and a second electrode pad 157 of the LED 150 may electrically contact the first electrode 127 and the second electrode 128, respectively.

The LED 150 may emit red light, green light or blue light, and may emit white light by using a fluorescent material or by combining colors. The LED 150 may include a first semiconductor layer 153, a second semiconductor layer 151, and an active layer 152 between the first semiconductor layer 153 and the second semiconductor layer 151.

The first semiconductor layer 153 may include, for example, a p-type semiconductor layer. The first semiconductor layer 153 may include a semiconductor material having a composition formula of $In_xAl_yGa_{1-x-y}N$ ($0 \le x \le 1$, $0 \le y \le 1$, $0 \le x+y \le 1$), for example, at least one selected from GaN, AlN, AlGaN, InGaN, InN, InAlGaN and AlInN, and may be doped with a p-type dopant such as Mg, Zn, Ca, Sr, and Ba.

The second semiconductor layer 151 may be, for example, an n-type semiconductor layer. The second semiconductor layer 151 may include a semiconductor material having a composition formula of $In_xAl_yGa_{1-x-y}N$ ($0 \le x \le 1$, $0 \le y \le 1$, $0 \le x+y \le 1$), for example, at least one selected from GaN, AlN, AlGaN, InGaN, InN, InAlGaN and AlInN, and may be doped with an n-type dopant such as Si, Ge, and Sn.

Doping types of the first semiconductor layer 153 and the second semiconductor layer 151 described above are merely exemplary, and are not limited thereto. Alternatively, the first semiconductor layer 153 may be an n-type semiconductor layer, and the second semiconductor layer 151 may be a p-type semiconductor layer.

The active layer 152 is a region where electrons and holes recombine, and when the electrons and the holes recombine, an energy level is transited to a lower energy level to generate light having a wavelength corresponding to a transited energy level. In an embodiment, the active layer 152 may include, for example, a semiconductor material having a composition formula of $In_xAl_yGa_{1-x-y}N$ ($0 \le x \le 1$, $0 \le y \le 1$, $0 \le x+y \le 1$), and may have a single quantum well structure or a multi quantum well ("MQW") structure. In an embodiment, the active layer 152 may have a quantum wire structure or a quantum dot structure.

The LED 150 may be a flip type, that is, a first electrode pad 156 and a second electrode pad 157 are disposed in parallel with each other, but is not limited thereto. Alternatively, the LED 150 may be a vertical type.

The first electrode 127 and the second electrode 128 may be transparent electrodes or reflective electrodes. A reflective electrode may include a reflective layer including a compound of at least one material selected from Ag, Mg, Al, Pt, Pd, Au, Ni, Nd, Ir and Cr, and a transparent or semi-transparent electrode on the reflective layer. The transparent or semi-transparent electrode may include a conductive oxide, such as indium tin oxide ("ITO"), indium zinc oxide ("IZO"), zinc oxide (ZnO), indium oxide ($In_2O_3$), indium gallium oxide ("IGO") and aluminum zinc oxide ("AZO").

Hereinafter, for convenience of description, embodiments where the LED 150 is an inorganic LED ("ILED") will be described in detail, but is not limited thereto. Alternatively, the LED 150 may include an organic light-emitting diode ("OLED").

Figure 3A:
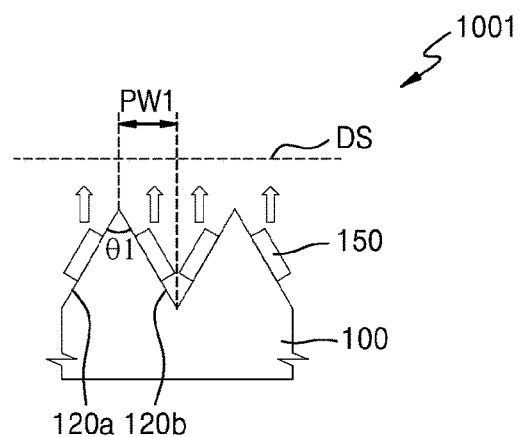
FIGS. 3A and 3B are conceptual diagrams illustrating a variation in luminance when the display apparatus of FIG. 1 is stretched.
Figure 3B:
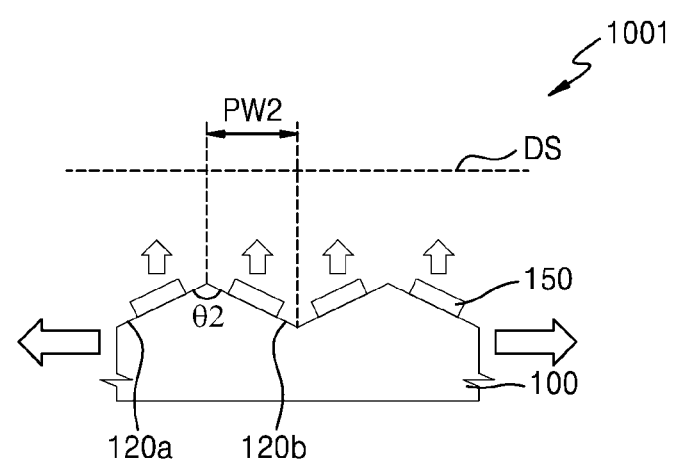

FIGS. 3A and 3B are conceptual diagrams illustrating a variation in luminance when the display apparatus of FIG. 1 is stretched. More particularly, FIGS. 3A and 3B show that luminance varies less when the display apparatus 1001 is stretched.

FIG. 3A shows the display apparatus 1001 at an initial stage, that is, the stretchable substrate 100 is not stretched or contracted. An angle formed by two adjacent inclined surfaces 120a and 120b is θ1, and the LED 150 on each of the inclined surfaces 120a and 120b defines a pixel having a width PW1 on a display surface DS. Here, the display surface DS is a virtual surface, which is recognized as if images output from the LEDs 150 by being turned-on or turned-off in response to image information are located thereon. A cover member that is stretchable and transparent may be at a location of the display surface DS.

FIG. 3B shows the display apparatus 1001 in which the stretchable substrate 100 is stretched. Since the stretchable substrate 100 stretches in opposite directions, the pixel has an increased width PW2, and a pixel per inch ("PPI"), that is, the number of pixels per unit length, is reduced. In such an embodiment, since the stretchable substrate 100 is stretched, the angle θ1 formed by the two adjacent inclined surfaces 120a and 120b changes, e.g., increases, to an angle θ2, and an inclination angle of each of the two adjacent inclined surfaces 120a and 120b with respect to the display surface DS decreases. Therefore, an intensity of light emitted from the LED 150 toward the display surface DS increases when the stretchable substrate 100 is stretched.

If the intensity of light emitted from the LED 150 toward the display surface DS is constant when the stretchable substrate 100 is stretched, luminance is reduced due to the reduced PPI. In an embodiment, the display apparatus 1001 has a structure, in which the inclination angles of the inclined surfaces 120a and 120b, on which the LEDs 150 are located, vary depending on stretched degree of the stretchable substrate 100, and thus, the intensity of light emitted from the LED 150 toward the display surface DS increases when the stretchable substrate 100 is stretched. Herein, the stretched degree of the stretchable substrate may be defined by a stretching ratio of the stretchable substrate or a ratio of the quantity of a length of the stretchable substrate subtracted by a minimum length of the stretchable substrate with respect to the quantity of a maximum length of the stretchable substrate subtracted by a minimum length of the stretchable substrate. Therefore, luminance reduction due to the PPI reduction may be substantially minimized or effectively prevented.

FIGS. 4A to 4F are diagrams showing an exemplary embodiment of a method of manufacturing the display apparatus 1001 of FIG. 1.

An embodiment of the display apparatus 1001 may be manufactured through the following processes of an embodiment of the method of manufacturing.

Figure 4A:
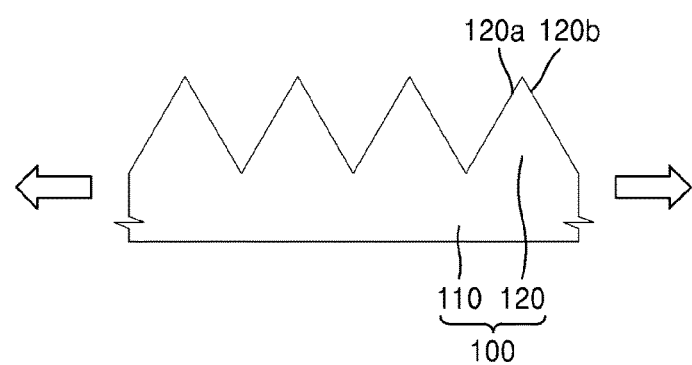
FIGS. 4A to 4F are diagrams illustrating an exemplary embodiment of a method of manufacturing the display apparatus of FIG. 1.

In an embodiment, as shown in FIG. 4A, the stretchable substrate 100 is prepared. The stretchable substrate 100 includes a flat portion 110, and protrusions 120 protruding from the flat portion 110 and each including two inclined surfaces 120a and 120b. In such an embodiment, the stretchable substrate 100 may include a thin film transistor TFT, as shown in FIG. 2, and the first electrode 127 and the second electrode 128 that are to be bonded with the LED 150 may be disposed on each of the inclined surfaces 120a and 120b.

Figure 4B:
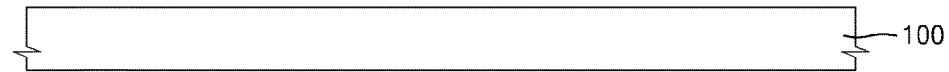

In such an embodiment, as shown in FIG. 4B, the stretchable substrate 100 is stretched in opposite directions. In FIG. 4B, as the stretchable substrate 100 is stretched, the protruding portions are completely vanished and the stretchable substrate 100 is shown flat for convenience for illustration. However, an upper surface of the stretchable substrate 100 may be uneven to some degree.

Figure 4C:
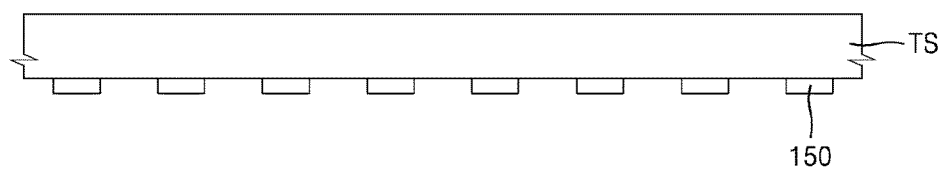
Figure 4D:
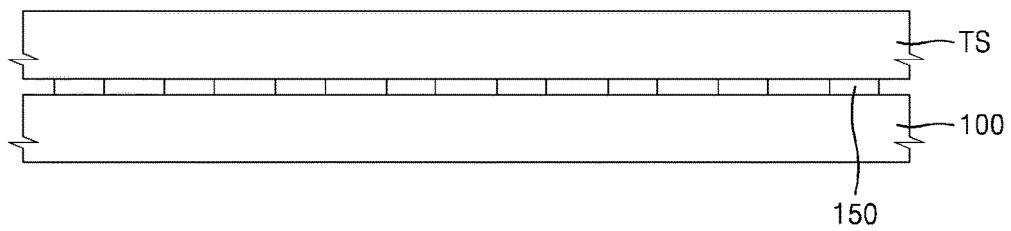

In such an embodiment, as shown in FIGS. 4C and 4D, a transfer substrate TS may be used to transfer the LEDs 150 onto the stretchable substrate 100. The transfer substrate TS may include, for example, an elastic copolymer material, to attach or detach the LEDs 150 by using a surface force.

Figure 4E:
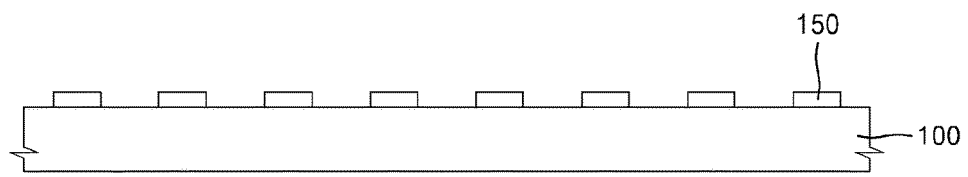

As shown in FIG. 4E, the LEDs 150 are transferred onto the stretchable substrate 100. The LEDs 150 may be bonded to electrode patterns provided in advance on the stretchable substrate 100 that has been stretched.

Figure 4F:
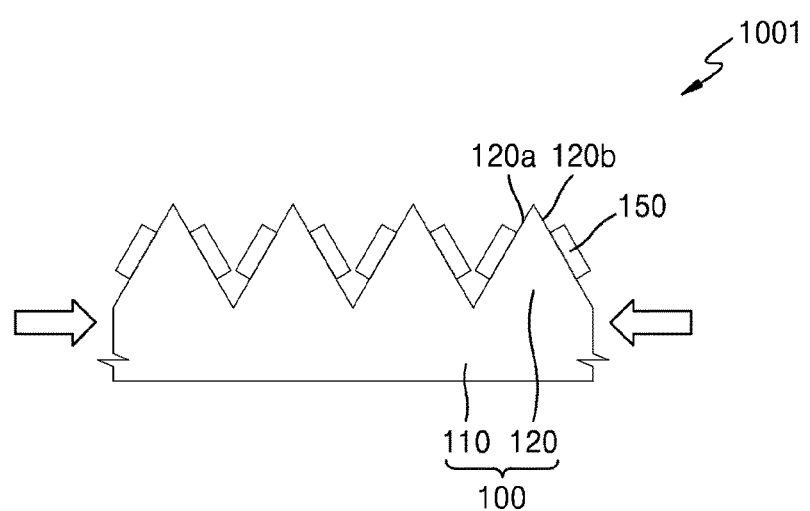

In such an embodiment, the LEDs 150 are transferred and then the stretchable substrate 100 in the stretched state is returned to an original state thereof, such that the display apparatus 1001 as shown in FIG. 4F is manufactured.

Figure 5:
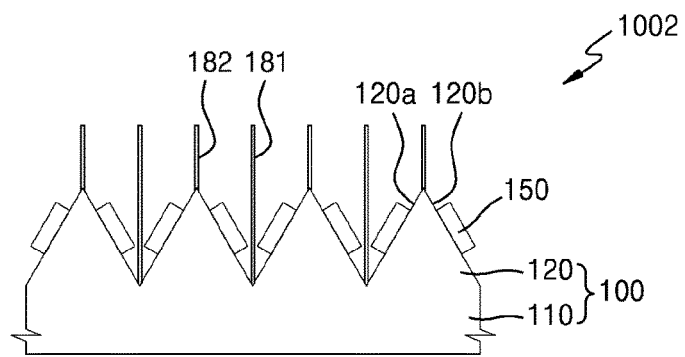
FIG. 5 is a schematic cross-sectional view of a display apparatus according to an alternative embodiment.

FIG. 5 is a schematic cross-sectional view of a display apparatus 1002 according to an alternative embodiment.

The display apparatus 1002 shown in FIG. 5 is substantially the same as the display apparatus 1001 of FIG. 1 except that barrier walls 181 and 182 are further disposed between adjacent LEDs 150. The same or like elements shown in FIG. 5 have been labeled with the same reference characters as used above to describe embodiments of the display apparatus described above with reference to FIG. 1, and any repetitive detailed description thereof will hereinafter be omitted or simplified.

In such an embodiment, the barrier walls 181 and 182 may be provided to effectively prevent color mixture between adjacent LEDs 150. The barrier walls 181 and 182 may be reflective plates that reflect light, or absorption plates that absorb light. The barrier walls 181 and 182 are between every two adjacent LEDs 150, but are not limited thereto. Alternatively, the barrier wall 181 may be disposed only on a region between every two adjacent protrusions 120, or the barrier wall 182 may be disposed only at a center of each protrusion 120.

Figure 6:
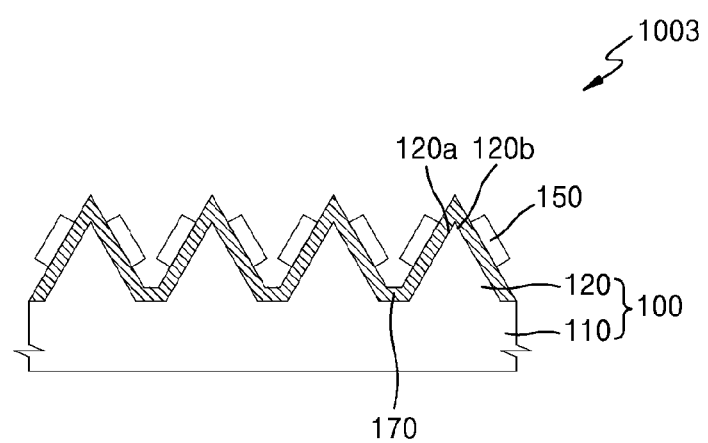
FIG. 6 is a schematic cross-sectional view of a display apparatus according to another alternative embodiment.

FIG. 6 is a schematic cross-sectional view of a display apparatus 1003 according to another alternative embodiment.

The display apparatus 1003 of FIG. 6 is substantially the same as the display apparatus 1001 of FIG. 1, except that a stretchable film 170 is further disposed along the inclined surfaces 120a and 120b of the protrusions 120 and the LEDs 150 are on the stretchable film 170. The same or like elements shown in FIG. 6 have been labeled with the same reference characters as used above to describe embodiments of the display apparatus described above with reference to FIG. 1, and any repetitive detailed description thereof will hereinafter be omitted or simplified.

In an embodiment, as shown in FIG. 6, the display apparatus 1003 may further include the stretchable film 170 to improve convenience in manufacturing processes. In such an embodiment, the effect of implementing the display having less variation in luminance with respect to the stretched degree of the display apparatus 1003 is substantially the same as that of the embodiment of the display apparatus 1001 described above.

FIGS. 7A to 7E are diagrams illustrating an exemplary embodiment of a method of manufacturing the display apparatus 1003 of FIG. 6.

Figure 7A:
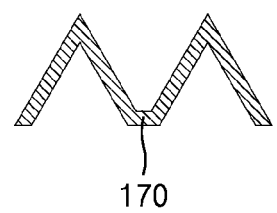
FIGS. 7A to 7E are diagrams illustrating an exemplary embodiment of a method of manufacturing the display apparatus of FIG. 6.
Figure 7B:
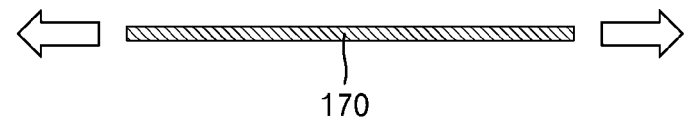

In an embodiment, as shown in FIG. 7A, the stretchable film 170 having inclined surfaces that are to be provided in the display apparatus is prepared. In such an embodiment, the stretchable film 170 has a constant thickness, such that the stretchable film 170 may be completely flatten through a stretching operation as shown in FIG. 7B. Electrode patterns may be provided in advance on the stretchable film 170 for electrically conducting with the LEDs 150.

Figure 7C:
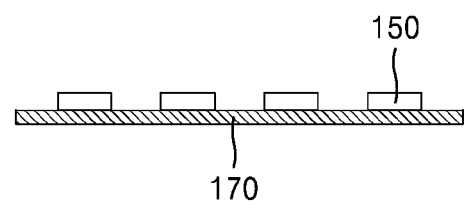

In such an embodiment, as shown in FIG. 7C, the LEDs 150 are transferred onto the stretchable film 170.

Figure 7D:
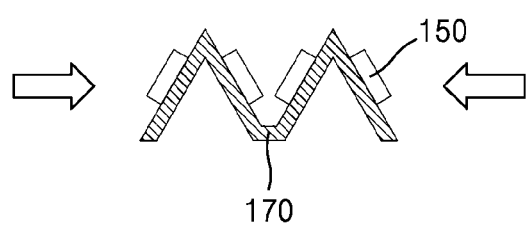
Figure 7E:
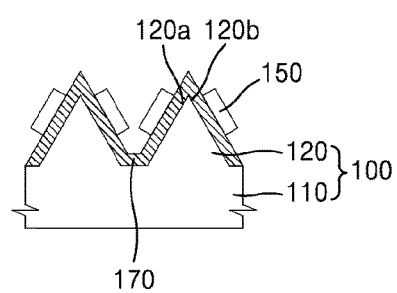

In such an embodiment, as shown in FIG. 7D, the stretchable film 170 is recovered to an original state thereof, and after that, the stretchable film 170 is attached to the stretchable substrate 100 having the protrusions 120 each including the inclined surfaces 120a and 120b as shown in FIG. 7E.

Figure 8:
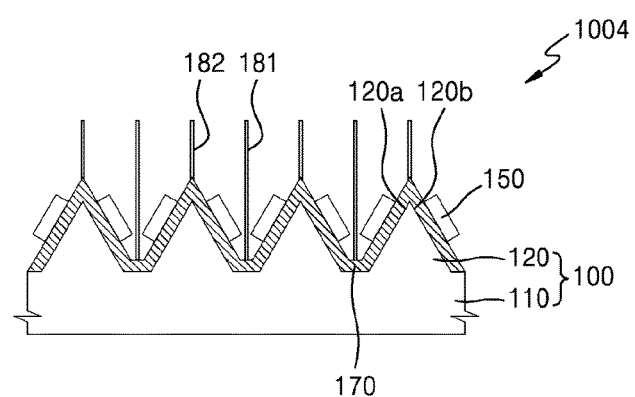
FIG. 8 is a schematic cross-sectional view of a display apparatus according to another alternative embodiment.

FIG. 8 is a schematic cross-sectional view of a display apparatus 1004 according to another alternative embodiment.

The display apparatus 1004 of FIG. 8 is substantially the same as the display apparatus 1003 of FIG. 6, except that the barrier walls 181 and 182 are further provided for preventing color mixture.

Figure 9:
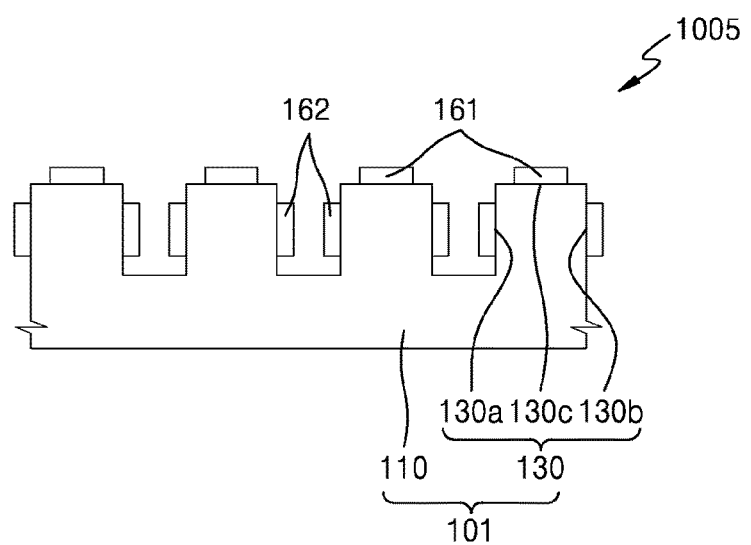
FIG. 9 is a schematic cross-sectional view of a display apparatus according to another alternative embodiment.

FIG. 9 is a schematic cross-sectional view of a display apparatus 1005 according to another alternative embodiment.

The display apparatus 1005 is substantially the same as the display apparatus 1001 of FIG. 1 except for a shape of a protrusion 130. In an embodiment, as shown in FIG. 9, the display apparatus 1005 includes the flat portion 110 and protrusions 130 protruding from the flat portion 110 and including bent surfaces. The protrusions 130 may each include two side surfaces 130a and 130b having a predetermined inclination angle with respect to the flat portion 110 and spaced apart from each other, and an upper flat surface 130c connecting the two side surfaces 130a and 130b to each other. In such an embodiment, a first LED 161 is disposed on the upper flat surface 130c, and second LEDs 162 are respectively disposed on the two side surfaces 130a and 130b.

In such an embodiment, as shown in FIG. 9, the two side surfaces 130a and 130b are disposed at nearly right angles or about 90 degrees with respect to the upper flat surface 130c, for example, but are not limited thereto. The angles of the two side surfaces 130a and 130b may be determined to effectively hide the second LEDs 162 disposed on the two side surfaces 130a and 130b at an initial stage. In one embodiment, for example, the above angles may be slightly less than a right angle, that is, a cross-sectional shape of the protrusion 130 may be a reverse trapezoidal shape.

In such an embodiment, the first LED 161 is exposed independently of the stretched degree of a stretchable substrate 101. In such an embodiment, the second LEDs 162 are not exposed, but are hidden at the initial stage, and then, may be exposed when the stretchable substrate 101 is stretched.

In such an embodiment of the display apparatus 1005, the first LED 161 operates as a display pixel that is turned on or off in response to image information independently of the stretched degree of the stretchable substrate 101, and the second LEDs 162 selectively operate as display pixels based on a stretched degree of the stretchable substrate 101.

Figure 10A:
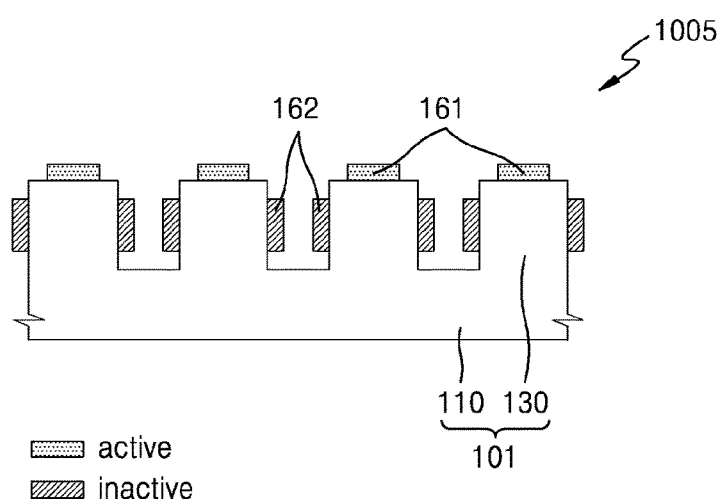
FIGS. 10A and 10B are diagrams for illustrating light-emitting diodes ("LED"s) included in a display apparatus that operate as pixels based on stretching of the display apparatus of FIG. 9.
Figure 10B:
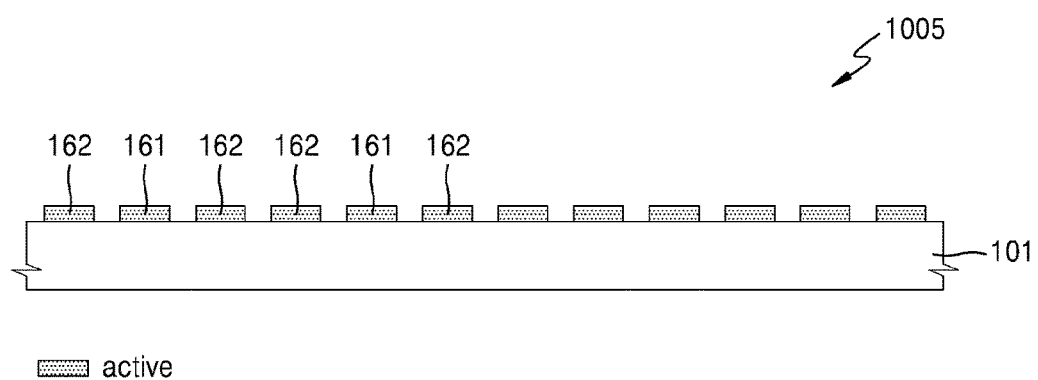

FIGS. 10A and 10B exemplarily illustrate the first and second LEDs 161 and 162 in the display apparatus 1005 that operate as display pixels according to the stretching of the stretchable substrate 101 of FIG. 9.

Referring to FIG. 10A, when the stretchable substrate 101 is in an initial state, that is, not stretched, only the first LED 161 operates as a pixel. In the initial state, only the first LED 161 may be turned on or off in response to the image information, to be in an active state. In the initial state, the second LEDs 162 are hidden, and thus, do not operate, to be in an inactive state.

FIG. 10A illustrates that the second LEDs 162 do not operate as pixels at the initial stage, in which the stretchable substrate 101 is not stretched. However, the second LEDs 162 do not operate as pixels exactly on stretching the stretchable substrate 101, that is, the second LEDs 162 do not operate as pixels either, in a case where the stretchable substrate 101 is stretched in a degree less than a predetermined stretched degree.

Referring to FIG. 10B, the stretchable substrate 101 is stretched and the second LEDs 162 are all exposed. When the stretchable substrate 101 is stretched, the first LEDs 161 and the second LEDs 162 operate as pixels. That is, each of the first LEDs 161 and the second LEDs 162 is in the active state and is turned on or off in response to the image information.

In an embodiment, each of the first LEDs 161 and the second LEDs 162 is in the active state when the stretchable substrate 101 is completely stretched, that is, the side surfaces 130a and 130b and the upper flat surface 130c shown in FIG. 9 are in a same line, but is not limited thereto. Alternatively, when the stretchable substrate 101 is stretched by a predetermined stretched degree or greater and the second LEDs 162 are sufficiently exposed to function as pixels, the second LEDs 162 may be switched to the active states.

In an embodiment of the display apparatus 1005, the hidden pixels are exposed and hidden again based on the stretching and contracting of the stretchable substrate 101 as described above, the PPI is not substantially changed according to the change in the stretching state. Therefore, the luminance is not substantially changed according to the change in the stretching state.

Hereinafter, alternative embodiments of a display apparatus having hidden pixels will be described.

Figure 11:
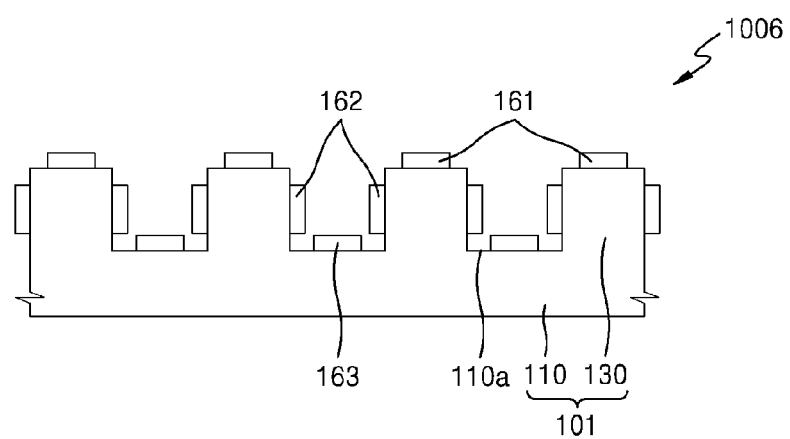
FIG. 11 is a schematic cross-sectional view of a display apparatus according to another alternative embodiment.

FIG. 11 is a schematic cross-sectional view of a display apparatus 1006 according to another alternative embodiment.

The display apparatus 1006 of FIG. 11 is substantially the same as the display apparatus 1005 of FIG. 9, except for third LEDs 163 further disposed on lower flat surfaces 110a of the flat portion 110 between the protrusions 130.

In such an embodiment, the third LEDs 163 are also exposed independently of the stretched degree of the stretchable substrate 101, the third LEDs 163 operate as display pixels that are turned on or off in response to image information independently of the stretched degree of the stretchable substrate 101, like the first LEDs 161. The second LEDs 162 may operate as display pixels, when the stretchable substrate 101 is stretched by a predetermined stretched degree or greater.

Figure 12:
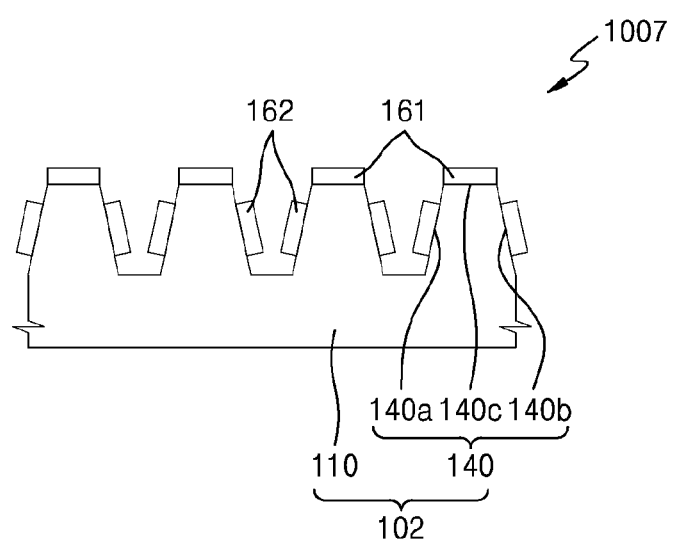
FIG. 12 is a schematic cross-sectional view of a display apparatus according to another alternative embodiment.

FIG. 12 is a schematic cross-sectional view of a display apparatus 1007 according to another alternative embodiment.

The display apparatus 1007 of FIG. 12 is substantially the same as the display apparatus 1005 of FIG. 9, except for inclination angles of side surfaces 140a and 140b, that is, a cross-sectional shape of each protrusion 140. In an embodiment, the cross-sectional shape of the protrusion 140 may be a rectangular shape as shown in FIG. 9. Alternatively, the cross-sectional shape of the protrusion 140 may be a reverse trapezoidal shape, as shown in FIG. 12. In such an embodiment where the cross-sectional shape of the protrusion 140 has a trapezoidal shape as shown in FIG. 12, the manufacturing process, e.g., a process of transferring the LEDs may be performed easily. In such an embodiment, the hidden LEDs may be effectively exposed by stretching a stretchable substrate 102 to a less degree.

The first LEDs 161 on upper flat surfaces 140c of the protrusions 140 operate as display pixels that are turned on or off in response to image information independently of the stretched degree of the stretchable substrate 102.

The second LEDs 162 on side surfaces 140a and 140b of the protrusions 140 are turned off and do not operate as display pixels in a state where the stretchable substrate 102 is not stretched or is stretched less than a predetermined stretched degree, and operate as display pixels that are turned on or off in response to the image information in a state where the stretchable substrate 102 is stretched by the predetermined stretched degree or greater.

According to an embodiment of the display apparatus 1007, the number of second LEDs 162 operating as a pixel may vary depending on the stretched degree of the stretchable substrate 102.

Figure 13A:
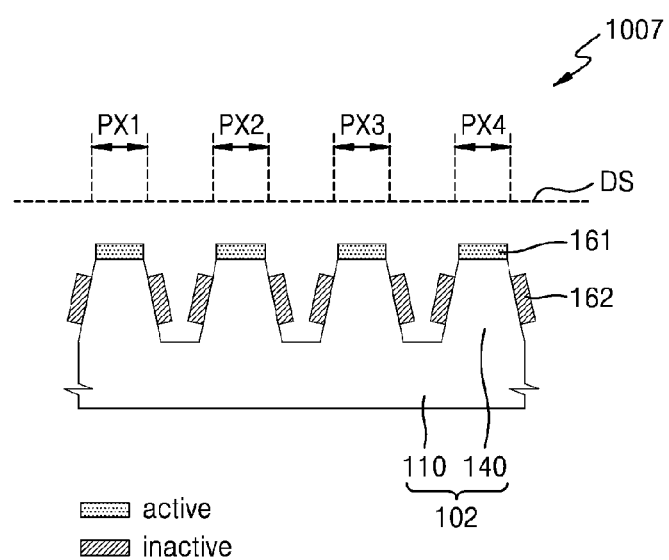
FIGS. 13A to 13C are diagrams for illustrating LEDs in the display apparatus that operates as pixels and a variation in the number of LEDs included in each pixel based on stretching of the display apparatus of FIG. 12.
Figure 13B:
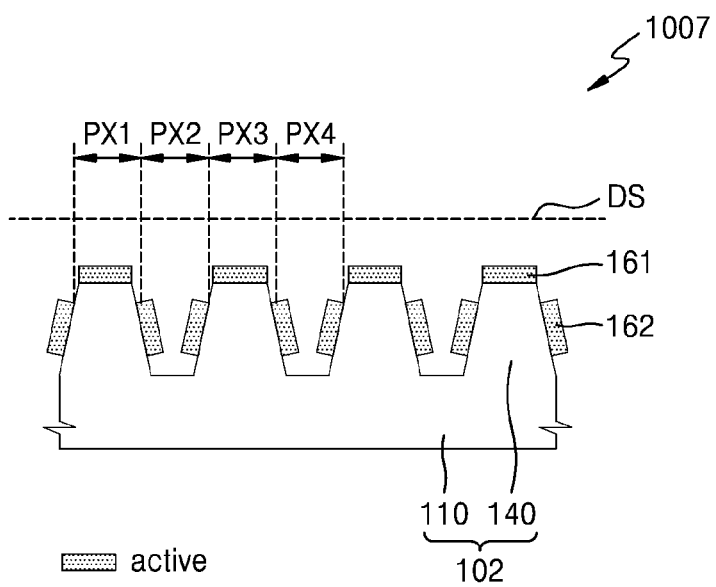
Figure 13C:
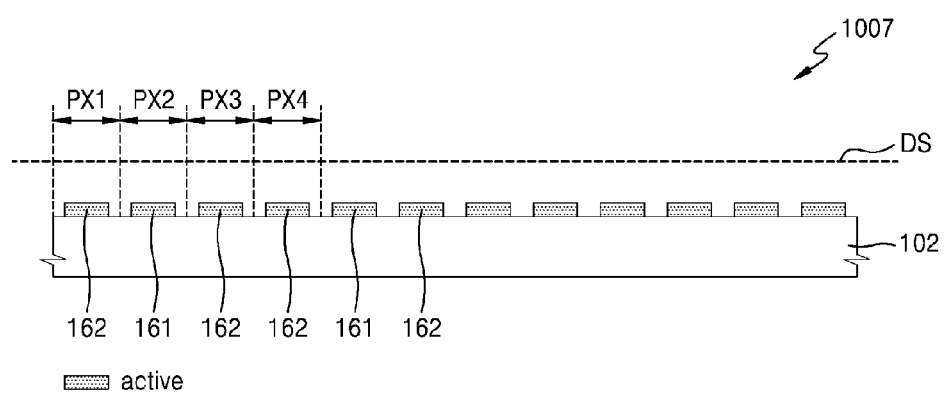

FIGS. 13A to 13C exemplarily illustrate the LEDs included in the display apparatus 1007 that operate as pixels based on stretching of the stretchable substrate 102 of FIG. 12, and variation in the number of LEDs included in each pixel.

Referring to FIG. 13A, in an initial stage in which the stretchable substrate 102 is not stretched, only the first LEDs 161 may operate as pixels or display pixels. In such an embodiment, the first LEDs 161 are in active states, in which the first LEDs 161 are turned on or off in response to image information, and the second LEDs 162 are hidden and do not operate, that is, in inactive states.

Referring to FIG. 13B, the stretchable substrate 102 is stretched by a predetermined stretched degree or greater, and thus, the second LEDs 162 may also operate as pixels. However, due to angles at which the second LEDs 162 are arranged, an intensity of light emitted from the second LEDs 162 toward the display surface DS is relatively less than that of light emitted from the first LEDs 161. In such an embodiment, a group of the second LEDs 162 defines, or collectively operates as, one pixel, for example, two adjacent second LEDs 162 may define, or collectively operate as, one pixel.

Referring to FIG. 13C, the stretchable substrate 102 is stretched, e.g., fully or completely, and the second LEDs 162 are all exposed. When the second LEDs 162 are all exposed, all of the first LEDs 161 and the second LEDs 162 operate as pixels. Accordingly, each of the first LEDs 161 and the second LEDs 162 is in the active state, that is, is turned on or off in response to image information. When the second LEDs 162 are all exposed, the intensity of light emitted from the first LEDs 161 and reaching the display surface DS is about the same as that of light emitted from the second LEDs 162 and reaching the display surface DS, and each of the first and second LEDs 161 and 162 may operate as one pixel.

In FIG. 13C, the stretchable substrate 102 is completely stretched, that is, the side surfaces 140a and 140b and the upper flat surface 140c shown in FIG. 12 are parallel, but one or more embodiments are not limited thereto. When the stretchable substrate 102 is stretched by a predetermined stretched degree or greater and each of the second LEDs 162 is sufficiently exposed to operate as one pixel, the second LEDs 162 may operate in the active states.

Figure 14:
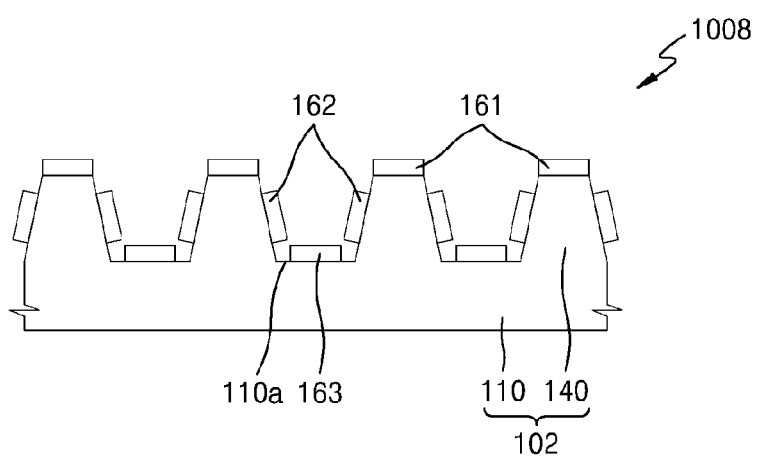
FIG. 14 is a schematic cross-sectional view of a display apparatus according to another alternative embodiment.

FIG. 14 is a schematic cross-sectional view of a display apparatus 1008 according to another alternative embodiment.

The display apparatus 1008 of FIG. 14 is substantially the same as the display apparatus 1007 of FIG. 12, except for third LEDs 163 disposed on lower flat surfaces 110a of the flat portion 110 between the protrusions 140.

In such an embodiment, the third LEDs 163 are exposed independently of the stretched degree of the stretchable substrate 102, such that the third LEDs 163 operate as display pixels that are turned on or off in response to image information independently of the stretched degree of the stretchable substrate 102 like the first LEDs 161. The second LEDs 162 operate as display pixels when the stretchable substrate 102 is stretched by a predetermined stretched degree or greater.

Figure 15:
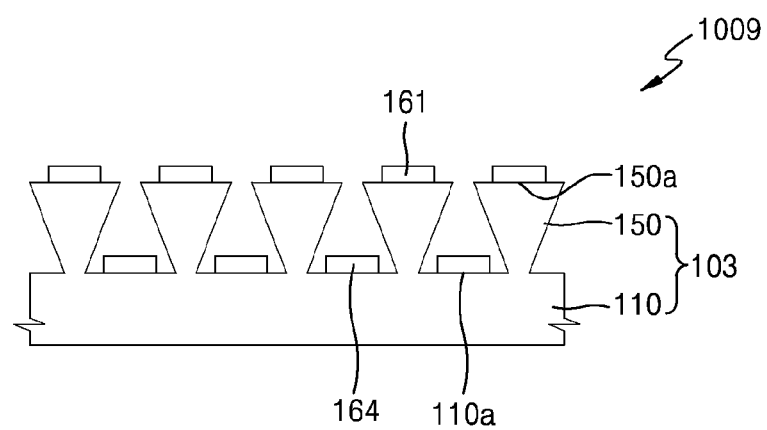
FIG. 15 is a schematic cross-sectional view of a display apparatus according to another alternative embodiment.

FIG. 15 is a schematic cross-sectional view of a display apparatus 1009 according to another alternative embodiment.

The display apparatus 1009 of FIG. 15 is substantially the same as the embodiments of the display apparatuses described above except for a shape of protrusions 150 on a stretchable substrate 103 and the arrangements of first and second LEDs 161 and 164.

In an embodiment, as shown in FIG. 15, each of the protrusions 150 has a reverse trapezoidal cross-section, an upper surface of which is larger than a lower surface, and each of the first LEDs 161 is disposed on an upper flat surface 150a and each of the second LEDs 164 is disposed on the lower flat surface 110a of the flat portion 110 between the protrusions 150.

The second LEDs 164 are hidden due to the shape of the protrusions 150, even when the second LEDs 164 are disposed on the flat surface, not on the inclined surface. Therefore, the first LEDs 161 operate as display pixels independently of the stretching state of the stretchable substrate 103. The second LEDs 164 do not operate as display pixels in a state where the stretchable substrate 103 is not stretched or is stretched less than a predetermined stretched degree, and operate as the display pixels that are turned on or off in response to image information when the stretchable substrate 103 is stretched by the predetermined stretched degree or greater.

Figure 16:
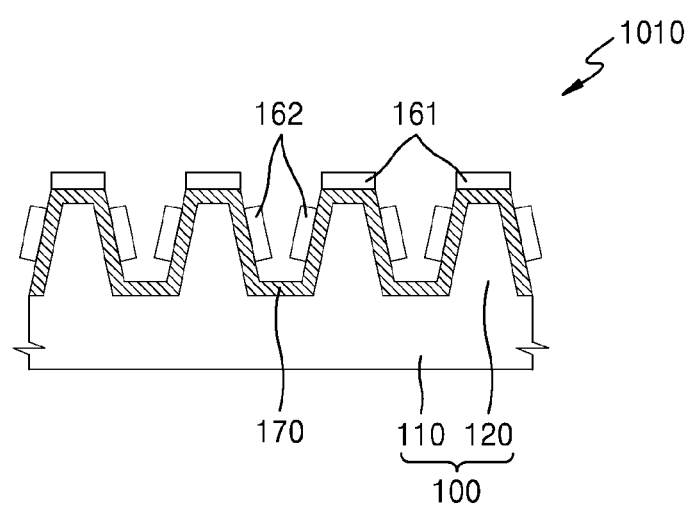
FIG. 16 is a schematic cross-sectional view of a display apparatus according to another alternative embodiment.

FIG. 16 is a schematic cross-sectional view of a display apparatus 1010 according to another alternative embodiment.

The display apparatus 1010 of FIG. 16 is substantially the same as the display apparatus 1007 of FIG. 12, except that the stretchable film 170 is further disposed along surfaces of the protrusions 120 and the flat portion 110 of the stretchable substrate 100. The stretchable film 170 is provided for convenience of manufacturing processes as described above with reference to FIGS. 7A to 7E, and may be applied to the display apparatuses 1005, 1006, 1008, and 1009 illustrated with reference to FIGS. 9, 11, 14 and 15.

According to embodiments of the display apparatus according to the invention, the LEDs are disposed threedimensionally on the stretchable substrate, and thus, the display apparatus may be easily stretched.

According to embodiments of the display apparatus according to the invention, the display apparatus has substantially constant luminance even when the stretching state or stretched degree is changed.

It should be understood that embodiments described herein should be considered in a descriptive sense only and not for purposes of limitation. Descriptions of features or aspects within each embodiment should typically be considered as available for other similar features or aspects in other embodiments.

While some embodiments of the invention have been described with reference to the figures, it will be understood by those of ordinary skill in the art that various changes in form and details may be made therein without departing from the spirit and scope as defined by the following claims.

What is claimed is:

1. A display apparatus comprising:
   a plurality of light-emitting diodes;
   a stretchable substrate comprising:
      a flat portion including a flat surface; and
      a plurality of protrusions protruding from the flat portion, wherein each of the protrusions is stretchable and has an inclined surface with respect to the flat surface, and at least some light-emitting diodes of the plurality of light-emitting diodes are disposed on the inclined surface, wherein an inclination angle of the inclined surface is variable with respect to extension or reduction of the stretchable substrate; and
   a plurality of thin film transistors disposed inside the stretchable substrate and connected to the light-emitting diodes.

2. The display apparatus of claim 1, wherein
   the bent surface of each of the protrusions comprises an inclined surface, and
   a light-emitting diode of the light-emitting diodes is disposed on the inclined surface.

3. The display apparatus of claim 2, the stretchable substrate further comprises a barrier wall disposed between the light-emitting diodes.

4. The display apparatus of claim 3, wherein the barrier wall is disposed on the flat portion and between two adjacent protrusions of the protrusions.

5. The display apparatus of claim 3, wherein the barrier wall is disposed on a center of a protrusion of the protrusions.

6. The display apparatus of claim 3, wherein the barrier wall comprises a reflective plate or an absorption plate.

7. The display apparatus of claim 1, further comprising:
   a stretchable film on the stretchable substrate and in contact with surfaces of the protrusions,
   wherein the light-emitting diodes are disposed on the stretchable film.

8. The display apparatus of claim 1, wherein each of the protrusions has two side surfaces having inclination angles with respect to the flat portion and spaced apart from each other, and an upper flat surface connecting the two side surfaces.

9. The display apparatus of claim 8, wherein the light-emitting diodes comprise:
   a first light-emitting diode on the upper flat surface; and
   a second light-emitting diode on at least one of the two side surfaces.

10. The display apparatus of claim 9, wherein the first light-emitting diode operates as a display pixel, which is turned on or off in response to image information, independently of a stretched degree of the stretchable substrate.

11. The display apparatus of claim 10, wherein
    the second light-emitting diode does not operate as the display pixel in a state in which the stretchable substrate is not stretched or is stretched less than a predetermined stretched degree, and
    the second light-emitting diode operates as the display pixel in a state in which the stretchable substrate is stretched by the predetermined stretched degree or greater.

12. The display apparatus of claim 11, wherein
    one or more of the second light-emitting diode define one pixel, and
    a number of the second light-emitting diode in the one pixel varies depending on the stretched degree of the stretchable substrate.

13. The display apparatus of claim 9, wherein the light-emitting diodes further comprise a third light-emitting diode disposed on the flat portion and between two adjacent protrusions of the protrusions.

14. The display apparatus of claim 13, wherein the first light-emitting diode and the third light-emitting diode operate as a display pixel, which is turned on or off in response to image information, independently of a stretched degree of the stretchable substrate.

15. The display apparatus of claim 14, wherein
    the second light-emitting diode does not operate as the display pixel in a state in which the stretchable substrate is not stretched or is stretched less than a predetermined stretched degree, and
    the second light-emitting diode operates as the display pixel in a state in which the stretchable substrate is stretched by the predetermined stretched degree or greater.

16. The display apparatus of claim 8, wherein a cross-sectional shape of each of the protrusions is a reverse trapezoidal shape, in which an upper surface is larger than a lower surface.

17. The display apparatus of claim 16, wherein the f light-emitting diodes comprise:
    a first light-emitting diode on the upper flat surface; and
    a second light-emitting diode on the flat portion and between two adjacent protrusions of the protrusions.

18. The display apparatus of claim 17, wherein the first light-emitting diode operates as a display pixel, which is turned on or off in response to image information, independently of a stretched degree of the stretchable substrate.

19. The display apparatus of claim 17, wherein the second light-emitting diode does not operate as the display pixel in a state in which the stretchable substrate is not stretched or is stretched less than a predetermined stretched degree, and operates as the display pixels in a state in which the stretchable substrate is stretched by the predetermined stretched degree or greater.

20. The display apparatus of claim 8, further comprising:
    a stretchable film on the stretchable substrate and in contact with the two side surfaces and the upper flat surface of each of the protrusions,
    wherein the light-emitting diodes are disposed on the stretchable film.

* * * * *